US012759073B2

(12) United States Patent
Nunogaki

(10) Patent No.: US 12,759,073 B2
(45) Date of Patent: Oct. 13, 2026

(54) ALIGNMENT METHOD

(71) Applicant: DISCO CORPORATION, Tokyo (JP)

(72) Inventor: Toshitake Nunogaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 828 days.

(21) Appl. No.: 18/163,925

(22) Filed: Feb. 3, 2023

(65) Prior Publication Data

US 2023/0249284 A1 Aug. 10, 2023

(30) Foreign Application Priority Data

Feb. 10, 2022 (JP) ................................. 2022-019286

(51) Int. Cl.

| | |
|---|---|
| ***B23K 26/03*** | (2006.01) |
| ***B23K 26/08*** | (2014.01) |
| ***H10P 72/50*** | (2026.01) |
| *B23K 101/40* | (2006.01) |

(52) U.S. Cl.

CPC ........ *B23K 26/032* (2013.01); *B23K 26/0853* (2013.01); *B23K 2101/40* (2018.08); *H10P 72/50* (2026.01)

(58) Field of Classification Search

CPC .. B23K 26/032; B23K 26/0853; B23K 26/53; B23K 26/0869; B23K 2101/40; H10P 72/53; H10P 72/0606; H10P 72/50; B28D 7/00

USPC ..................................................... 219/121.83

See application file for complete search history.

(56) References Cited

U.S. PATENT DOCUMENTS 10,811,295 B2 * 10/2020 Miyata ................. G01B 11/002
2019/0001433 A1 1/2019 Yamamoto

FOREIGN PATENT DOCUMENTS

JP 60244803 A 12/1985
JP H09186061 A * 7/1997 ........... G01B 11/002
JP 2006253466 A * 9/2006 ........... G01B 11/002
JP 2016111143 A 6/2016

OTHER PUBLICATIONS

Machine Translation of JP-2006253466-A (Year: 2025).*
Machine Translation of JP-H09186061-A (Year: 2025).*
Search report issued by the Intellectual Property Office of Singapore in corresponding Patent Application No. 10202300273V, mailed Sep. 4, 2025.

* cited by examiner

*Primary Examiner* — John J Norton
*Assistant Examiner* — Thomas J Ward
(74) *Attorney, Agent, or Firm* — Greer Burns & Crain Ltd.

(57) ABSTRACT

An alignment method for aligning an orientation flat on a workpiece with a direction parallel to a desired direction includes a straight-line detection step of imaging the orientation flat by an imaging unit and detecting a straight-line segment in the resulting captured image, a first alignment step of calculating an off-angle between an extending direction of the straight-line segment and the desired direction, and, on the basis of the off-angle, positioning the orientation flat such that the extending direction extends parallel to the desired direction, and a second alignment step of imaging the orientation flat at a first position and a second position, which are spaced apart from each other along the desired direction, and positioning the orientation flat such that a line that connects together the orientation flat at the first position and the orientation flat at the second position extends parallel to the desired direction.

4 Claims, 6 Drawing Sheets

ALIGNMENT METHOD

BACKGROUND OF THE INVENTION

Field of the Invention

The present invention relates to an alignment method.

Description of the Related Art

Proposed as methods for forming a wafer from an ingot includes a method that includes applying a laser beam to the ingot with its convergence point positioned inside the ingot to form cleavage layers, and separating the wafer from the ingot with use of the cleavage layers as starting points (see, for example, Japanese Patent Laid-open No. 2016-111143).

According to Japanese Patent Laid-open No. 2016-111143, a moving direction of the convergence point of the laser beam is set in a direction orthogonal to a direction in which an off-angle is formed, specifically in a direction parallel to a second orientation flat. It is known that the method of Japanese Patent Laid-open No. 2016-111143 enables a large index amount to be set and improved productivity to be ensured because cracks are formed propagating along a c-plane from both sides of each cleavage layer and are allowed to extend over a significant length. Before the formation of these cleavage layers, alignment is executed to bring the moving direction of the convergence point and the second orientation flat into line with each other. This alignment is generally performed by pattern matching (see, for example, Japanese Patent Laid-open No. Sho 60-244803).

SUMMARY OF THE INVENTION

In the above-mentioned related art, the alignment is performed by recording (teaching) an orientation flat as a key pattern beforehand, imaging a wafer surface with an imaging unit under a microscope or the like, and detecting the orientation flat in the resulting captured image. There is however a problem in that, if the ingot is turned by vibrations or the like during transfer, the orientation flat substantially deviates in angle to make it difficult to perform the alignment, and repositioning operation by an operator is hence needed. Further, teaching work that records the orientation flat as the key pattern is performed by the operator, but takes man-hour and moreover may provoke a human mistake, raising a demand for improvements.

The present invention therefore has, as an object thereof, the provision of an alignment method that enables efficient and accurate performance of alignment even if an orientation flat has deviated substantially in angle.

In accordance with an aspect of the present invention, there is provided an alignment method for aligning an orientation flat that is formed on a workpiece, with a direction parallel to a desired direction, including a positioning step of positioning an imaging unit, which images the workpiece, at a position where the orientation flat can be imaged, a straight-line detection step of imaging the orientation flat by the imaging unit to acquire a captured image and detecting a straight-line segment in the captured image, a first alignment step of calculating an off-angle between an extending direction of the straight-line segment detected in the straight-line detection step and the desired direction, and, on the basis of the off-angle, positioning the orientation flat such that the extending direction of the straight-line segment extends parallel to the desired direction, and a second alignment step of, after performing the first alignment step, imaging the orientation flat at a first position and a second position, which are spaced apart from each other along the desired direction, and positioning the orientation flat such that a line that connects together the orientation flat at the first position and the orientation flat at the second position extends parallel to the desired direction.

Preferably, the second positioning step detects orientation flat images that have the same orientation flat ratio as an orientation flat ratio in an orientation flat image that serves as a reference, at the first position and the second position by pattern matching, calculates an off-angle between the orientation flat and the desired direction on the basis of XY coordinate positions of the orientation flat image detected at the first position and XY coordinate positions of the orientation flat image detected at the second position, and positions the orientation flat such that the orientation flat extends parallel to the desired direction.

Preferably, a captured image that has been acquired by imaging the orientation flat after application of alignment in the first alignment step is used as the orientation flat image that serves as the reference. As an alternative, an orientation flat image that has been created artificially beforehand is used as the orientation flat image that serves as the reference.

According to the present invention, alignment can be efficiently and accurately performed even if an orientation flat has deviated substantially in angle.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the attached drawings, a description will hereinafter be made in detail about an embodiment of the present invention and its modification. However, the present invention shall not be limited by details that will be described in the subsequent embodiment and modification. The elements of configurations that will hereinafter be described include those readily conceivable by persons skilled in the art and substantially the same ones. Further, the configurations that will hereinafter be described can be combined appropriately. Furthermore, various omissions, replacements, and modifications of configurations can be made without departing from the spirit of the present invention.

Figure 1:
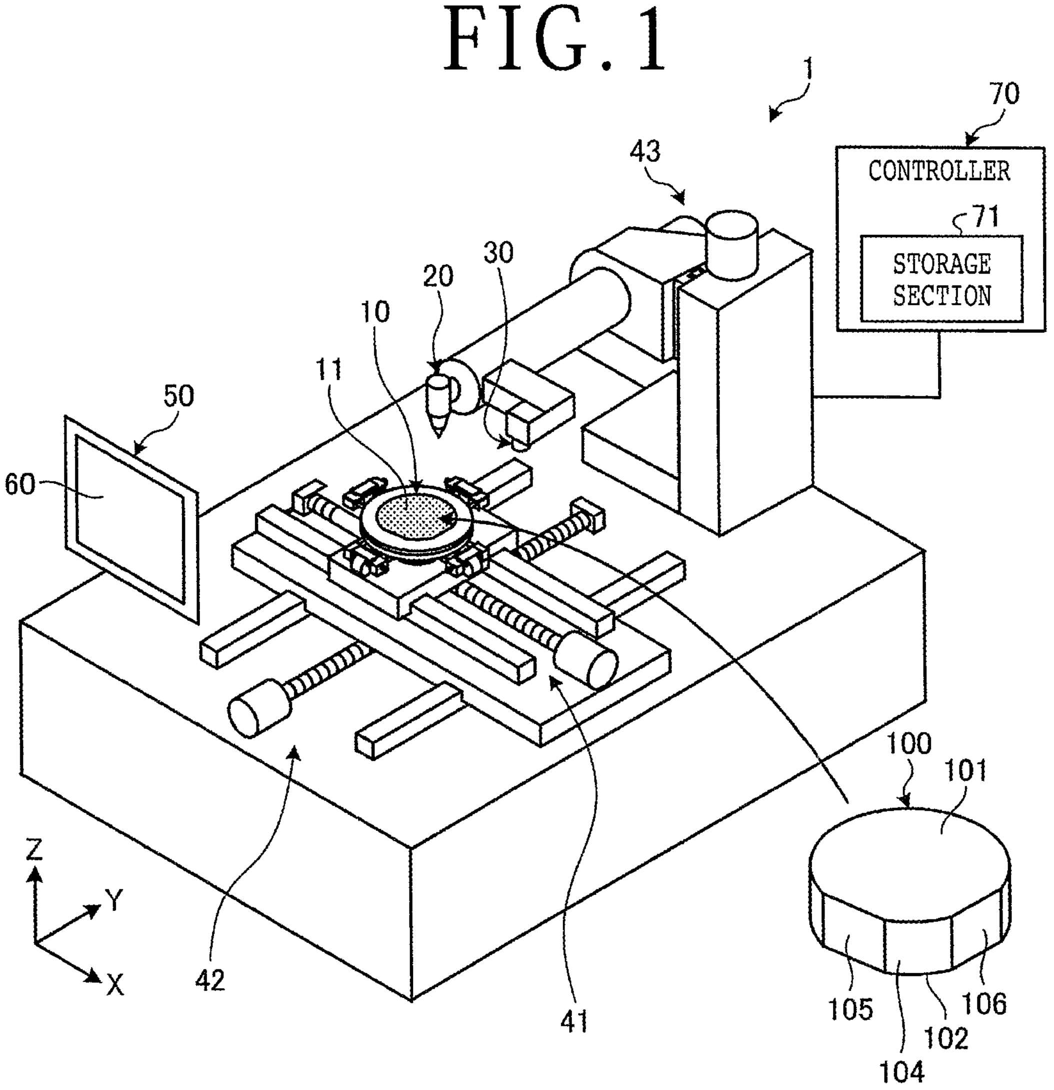
FIG. 1 is a perspective view illustrating a configuration example of a laser processing machine that performs an alignment method according to an embodiment of the present invention.
Figure 2:
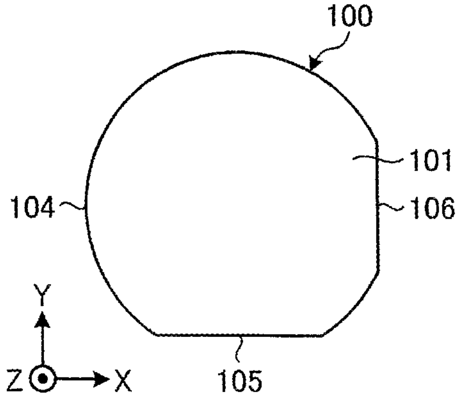
FIG. 2 is a top view illustrating an example of a workpiece as an alignment object to which the alignment method according to the embodiment is applied.

An alignment method according to the embodiment of the present invention will be described on the basis of FIGS. 1 through 10. FIG. 1 is a perspective view illustrating a configuration example of a laser processing machine 1 that performs the alignment method according to the embodiment. FIG. 2 is a top view illustrating an example of a workpiece 100 as an alignment object to which the alignment method according to this embodiment is applied. The laser processing machine 1 that performs the alignment method according to this embodiment includes, as illustrated in FIG. 1, a holding table 10, a laser beam irradiation unit 20, an imaging unit 30, an X-axis direction moving unit 41, a Y-axis direction moving unit 42, a Z-axis direction moving unit 43, a display unit 50, an input unit 60, and a controller 70.

In this embodiment, the workpiece 100 as the alignment object to which the alignment method according to this embodiment is applied is, for example, a single-crystal ingot formed from silicon carbide (SiC), gallium nitride (GaN), or the like, and formed in a cylindrical shape as a whole.

The workpiece 100 has, as illustrated in FIGS. 1 and 2, a first surface 101 as a substantially circular end face, a substantially circular second surface 102 on a side of a back surface of the first surface 101, and a peripheral surface 104 extending to an outer edge of the first surface 101 and an outer edge of the second surface 102. Also formed on the peripheral surface 104 of the workpiece 100 are a first orientation flat 105 that indicates a crystal orientation and a second orientation flat 106 that is orthogonal to the first orientation flat 105. In this embodiment, the first orientation flat 105 is formed with a longer straight-line segment than the second orientation flat 106.

The workpiece 100 also has a c-axis that is tilted at an off-angle in a direction toward the second orientation flat 106 with respect to a perpendicular line to the first surface 101, and a c-plane that is orthogonal to the c-axis. The c-plane is tilted at the same angle as the off-angle with respect to the first surface 101 of the workpiece 100. The off-angle is set, for example, in a range of 1° to 6° as desired. The direction toward which the off-angle is formed is orthogonal to an extending direction of the second orientation flat 106, and is parallel to the first orientation flat 105.

By applying a laser beam of a wavelength having transmissivity for the workpiece 100 with a moving direction of a convergence point of the laser beam set in a direction orthogonal to a direction toward which an off-angle is formed, in other words, in a direction parallel to the second orientation flat 106, modified portions are formed inside the workpiece 100, and then, cracks are formed propagating along the c-plane from both sides of each modified portion and are allowed to extend over a significant length. With use of cleavage layers, which include the modified portions and cracks, as starting points, a wafer is separated. It is to be noted that each modified portion is a region where, for example, a density, a refractive index, a mechanical strength, and other physical properties have become different from those of the surroundings.

The holding table 10 includes a disk-shaped frame body with a recessed portion formed therein, and a disk-shaped suction portion fitted in the recessed portion. The suction portion of the holding table 10 is formed from porous ceramics having a number of pores or a like material, and is connected with a vacuum suction source (not illustrated) via a vacuum suction passage (not illustrated). An upper surface of the suction portion of the holding table 10 serves as a holding surface 11 on which the workpiece 100 is to be placed as illustrated in FIG. 1. By a negative pressure introduced from the vacuum suction source, the holding surface 11 holds the placed workpiece 100 under suction. In this embodiment, the workpiece 100 is placed on the holding surface 11 with the first surface 101 directed upward, and the placed workpiece 100 is held under suction from a side of the second surface 102. An upper surface of the holding surface 11 and an upper surface of the frame body of the holding table 10 are arranged on the same plane, and are formed parallel to an XY plane that is a horizontal plane.

The holding table 10 is disposed movably in an X-axis direction, which is parallel to a horizontal direction, by the X-axis direction moving unit 41, and is also disposed movably in a Y-axis direction, which is parallel to the horizontal direction and is orthogonal to the X-axis direction, by the Y-axis direction moving unit 42. The holding table 10 is moved along the X-axis direction and the Y-axis direction by the X-axis direction moving unit 41 and the Y-axis direction moving unit 42, respectively, whereby the workpiece 100 held on the holding table 10 is moved in the X-axis direction and the Y-axis direction, respectively, relative to the convergence point that is formed by the laser beam irradiation unit 20, and the imaging unit 30. The holding table 10 is disposed rotatably by a rotary drive source (not illustrated) about a Z-axis, which is parallel to a vertical direction and is orthogonal to the XY plane.

In this embodiment, the laser beam irradiation unit 20 applies the laser beam of the wavelength, which has transmissivity for the workpiece 100, from a side of the first surface 101 to an inside of the workpiece 100 held on the holding table 10, whereby the cleavage layers are formed inside the workpiece 100 by the laser beam. The laser beam irradiation unit 20 includes, for example, a laser beam oscillator (not illustrated) that emits the laser beam, and a condenser (not illustrated) that condenses the laser beam emitted from the laser beam oscillator and applies the resulting condensed laser beam to the inside of the workpiece 100.

The condenser included in the laser beam irradiation unit 20 is disposed movably in the Z-axis direction by the Z-axis direction moving unit 43. By moving the condenser, which is included in the laser beam irradiation unit 20, along the Z-axis direction by the Z-axis direction moving unit 43, the convergence point of the laser beam is moved in the Z-axis direction relative to the workpiece 100 held on the holding table 10.

The imaging unit 30 includes an imaging device which images the first surface 101 and its outer edge, the first orientation flat 105, and the like of the workpiece 100 held on the holding table 10. The imaging device is, for example, a charge-coupled device (CCD) imaging device or a complementary metal oxide semiconductor (CMOS) imaging device. In this embodiment, the imaging unit 30 is arranged adjacent to the condenser included in the laser beam irradiation unit 20 such that the imaging unit 30 is movable integrally with the condenser included in the laser beam irradiation unit 20. Arranged in the imaging unit 30 is a base line (center line) 31 (see FIGS. 6 and 7), which extends along the X-axis direction and divides an imaging area into halves in the Y-axis direction.

The imaging unit 30 images three points, which are spaced apart from one another and are other than locations where the first orientation flat 105 and the second orientation flat 106 are formed, on the outer edge of the first surface 101 of the workpiece 100 held on the holding table 10 before the formation of cleavage layers, acquires images to be used to execute edge alignment for determination of precise center coordinates and a diameter, with the first surface 101 of the workpiece 100 being regarded to be circular, by geometrical arithmetic processing based on coordinates of the three points, and outputs the acquired images to the controller 70. In the image to be used to execute the edge alignment in this embodiment, the outer edge is used as a boundary, regions radially inside the outer edge, where illumination from the imaging unit 30 is reflected by the first surface 101 of the workpiece 100, are imaged with high luminance, and regions radially outside the outer edge, where the illumination from the imaging unit 30 is not reflected, are imaged with low luminance.

After execution of the edge alignment, the imaging unit 30 is positioned and directed toward a center of the first surface 101 of the workpiece 100 as determined by the edge alignment, executes autofocusing to automatically set an imaging focal point at the center of the first surface 101 of the workpiece 100, and executes automatic light-quantity control to control the light quantity of the illumination from the imaging unit 30 such that the center of the first surface 101 of the workpiece 100 can be imaged most clearly.

Further, the imaging unit 30 is positioned at the first orientation flat 105 of the workpiece 100, images the first orientation flat 105 to acquire images to be used to execute alignment (orientation flat alignment) in which the moving direction of the convergence point of the laser beam and the second orientation flat 106 are brought into line with each other with use of the first orientation flat 105, and outputs the acquired images to the controller 70. In the alignment method according to this embodiment, the processing of a first alignment step 1003 (see FIG. 3) and the processing of a second alignment step 1004 (see FIG. 3) are included in the processing of the orientation flat alignment. In each image to be used to execute the orientation flat alignment in this embodiment, the first orientation flat is used as a boundary, a region radially inside the first orientation flat 105, where the illumination from the imaging unit 30 is reflected by the first surface 101 of the workpiece 100, is imaged with high luminance, and a region radially outside the first orientation flat 105, where the illumination from the imaging unit 30 is not reflected, is imaged with low luminance. Images to be used to execute the orientation flat alignment in this embodiment are, for example, captured images 201 and 202 and an orientation flat image 203 (see FIGS. 6 and 7), and all of which will be mentioned subsequently herein. It is to be noted that, in the present invention, the imaging unit 30 is not limited to the foregoing, and the imaging unit 30 may be positioned at the second orientation flat 106 of the workpiece 100, may image the second orientation flat 106 to acquire images to be used to execute orientation flat alignment with use of the second orientation flat 106, and may output the acquired images to the controller 70.

The X-axis direction moving unit 41 and the Y-axis direction moving unit 42 move the holding table 10 along the X-axis direction and the Y-axis direction, respectively, relative to the condenser included in the laser beam irradiation unit 20. The Z-axis direction moving unit 43 moves the condenser, which is included in the laser beam irradiation unit 20, along the Z-axis direction relative to the holding table 10. The X-axis direction moving unit 41, the Y-axis direction moving unit 42, and the Z-axis direction moving unit 43 each include, for example, a known ball screw disposed rotatably about an axis of rotation in the X-axis, the Y-axis, or the Z-axis, a known pulse motor that rotates the ball screw about the axis of rotation, and known guide rails that support the holding table 10 or the condenser, which is included in the laser beam irradiation unit 20, movably in the X-axis direction, Y-axis direction, or Z-axis direction.

The X-axis direction moving unit 41, the Y-axis direction moving unit 42, and the Z-axis direction moving unit 43 each further include an encoder to read an angular position of the pulse motor, detect the relative position of the holding table 10 or the condenser, which is included in the laser beam irradiation unit 20, in the X-axis direction, Y-axis direction, or Z-axis direction on the basis of the angular position of the pulse motor as read by the encoder, and output the detected relative position to the controller 70. It is to be noted that the X-axis direction moving unit 41, the Y-axis direction moving unit 42, and the Z-axis direction moving unit 43 are each not limited to the configuration that detects the relative position of the holding table 10 or the condenser, which is included in the laser beam irradiation unit 20, by the encoder, and may each be configured by a linear scale parallel to the X-axis direction, Y-axis direction, or Z-axis direction, and a read head disposed movably in the X-axis direction, the Y-axis direction, or the Z-axis direction by the X-axis direction moving unit 41, the Y-axis direction moving unit 42, or the Z-axis direction moving unit 43 to read a graduation on the linear scale.

The display unit 50 is disposed, with its display screen side directed outward, on a cover (not illustrated) of the laser processing machine 1, and presents a display of setting of irradiation conditions of a laser beam by the laser processing machine 1, a display of results of edge alignment, autofocusing, automatic light-quantity control, orientation flat alignment, processing to form cleavage layers, or the like, or a like display to an operator for visual recognition. The display unit 50 is configured by a liquid crystal display device or the like. The display unit 50 is provided with an input unit 60 to be used when the operator inputs instruction information relating to various operations of the laser processing machine 1, irradiation conditions of a laser beam, presentation of images, and the like. The input unit 60 with which the display unit 50 is provided is configured by at least one of a touch panel included in the display unit 50, a key board, and the like.

The controller 70 controls operations of the individual elements of the laser processing machine 1 to make the laser processing machine 1 perform edge alignment, autofocusing, automatic light-quantity control, orientation flat alignment, processing to form cleaved layers by irradiation of a laser beam, and so on. The controller 70 performs image processing on an image to be used to execute edge alignment and images to be used to execute orientation flat alignment. In these kinds of image processing, calculation processing of various XY coordinates is performed using a machine rectangular coordinate system (XY coordinate system) that includes the center of the holding table 10 as an origin, and machine rectangular coordinate systems (XY coordinate system) that include centers of respective images as origins. The controller 70 includes a storage section 71 as illustrated in FIG. 1. The storage section 71 stores information on the diameter and thickness of the workpiece 100, the positions where the first orientation flat 105 and the second orientation flat 106 are formed, and the lengths of straight-line segments and the images to be used to execute the edge alignment and orientation flat alignment.

In this embodiment, the controller 70 includes a computer system. The computer system included in the controller 70 has an arithmetic processing unit having a microprocessor such as a central processing unit (CPU), a storage device having a memory such as a read only memory (ROM) or a random access memory (RAM), and an input/output interface device. The arithmetic processing unit of the controller 70 performs arithmetic processing in accordance with a computer program stored in the storage device of the controller 70, and outputs control signals, which are to be used to control the laser processing machine 1, to the individual elements of the laser processing machine 1 via the input/output interface device of the controller 70. In this embodiment, functions of the storage section 71 are realized by the storage device of the controller 70.

Figure 3:
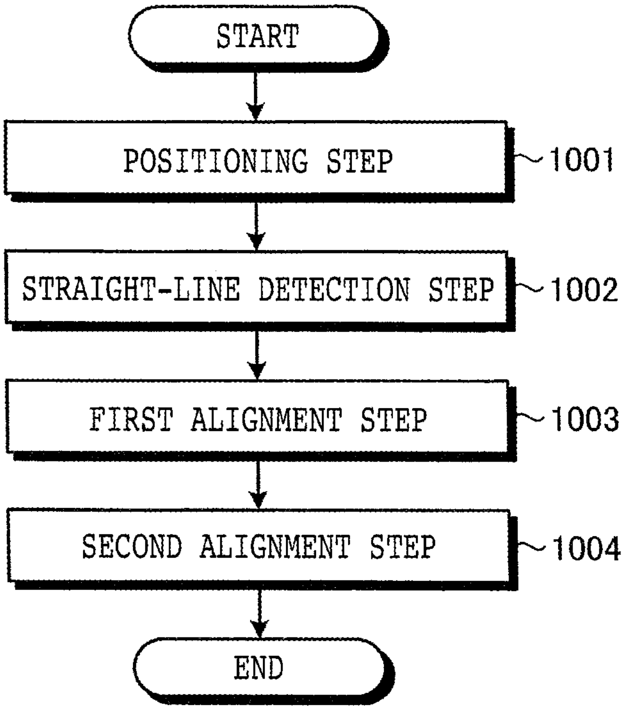
FIG. 3 is a flow chart illustrating processing procedures of the alignment method according to the embodiment.

The alignment method according to this embodiment will hereinafter be described on the basis of FIGS. 3 to 10. FIG. 3 is a flow chart illustrating processing procedures of the alignment method according to this embodiment. The alignment method according to this embodiment is an example of operation processing for the laser processing machine 1, and is a method that aligns the first orientation flat 105 or the second orientation flat 106, which is formed on the workpiece 100, with a direction parallel to the desired direction. As illustrated in FIG. 3, the alignment method according to this embodiment includes a positioning step 1001, a straight-line detection step 1002, the first alignment step 1003, and the second alignment step 1004.

In this embodiment, the object to be aligned is set to be the first orientation flat 105 formed parallel to the direction toward which the off-angle is formed, and the desired direction as the target for alignment is set to be the direction parallel to the X-axis direction which is orthogonal to the Y-axis direction as the moving direction of the convergence point of the laser beam. In the present invention, however, the object to be aligned and the target for alignment are not limited to these. The object to be aligned may be set to be the second orientation flat 106, and the desired direction as the target for alignment may be set to be the Y-axis direction, or the desired direction as the target for alignment may be appropriately changed according to the setting of the moving direction of the convergence point of the laser beam or the object to be aligned. As the alignment method according to this embodiment uses the first orientation flat 105 formed with the longer straight-line segment than the second orientation flat 106, the alignment method according to this embodiment can further enhance the accuracy of the orientation flat alignment through the first alignment step 1003 and the second alignment step 1004, and is preferred accordingly.

In the alignment method according to this embodiment, before performing the positioning step 1001, the controller 70 first transfers the workpiece 100 onto the holding table 10 by a transfer unit (not illustrated) or the like, and holds the workpiece 100 on the holding table 10. The controller 70 next images, by the imaging unit 30, the three points which are spaced apart from one another and are other than the locations where the first orientation flat 105 and the second orientation flat 106 are formed, on the outer edge of the first surface 101 of the workpiece 100 held on the holding table 10 to acquire images, and executes edge alignment based on these images. After performing the edge alignment, the controller 70 makes the imaging unit 30 execute autofocusing and automatic light-quantity control.

In the edge alignment, on the basis of the totally three images, which are to be used to execute the edge alignment, of the outer edge of the first surface 101 of the workpiece 100, the controller 70 detects XY coordinates of the one point on the boundary between the high luminance and the low luminance in each image. The controller 70 then performs geometrical arithmetic processing based on the coordinates of the three points, thereby determining precise center coordinates (XY coordinates) and a diameter when the first surface 101 of the workpiece 100 is regarded to be circular.

Figure 4:
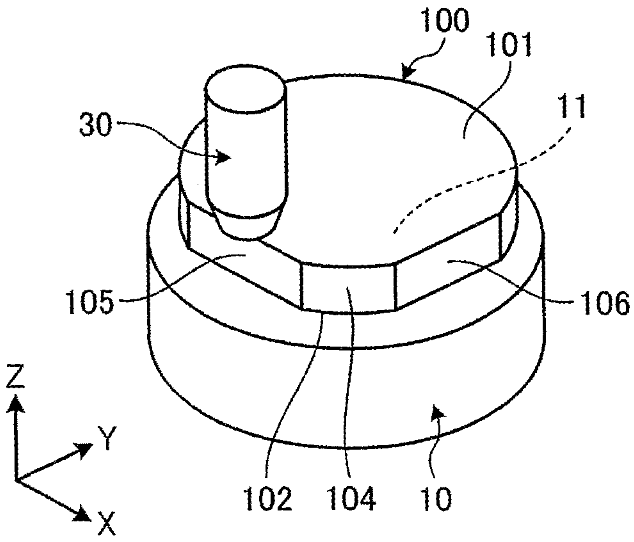
FIG. 4 is a perspective view illustrating a positioning step in FIG. 3.
Figure 5:
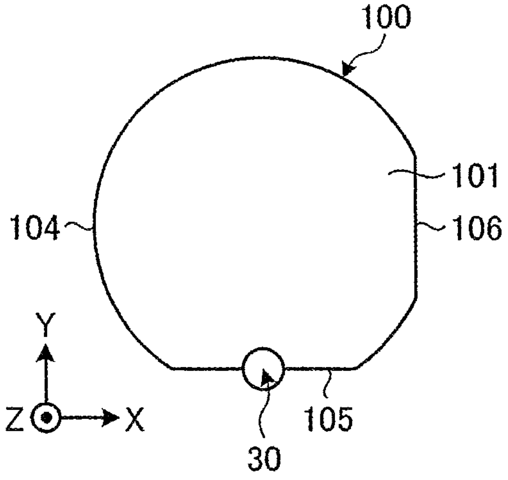
FIG. 5 is a top view illustrating the positioning step in FIG. 3.

FIGS. 4 and 5 are respectively a perspective view and a top view illustrating the positioning step 1001 in FIG. 3. As illustrated in FIGS. 4 and 5, the positioning step 1001 is performed to position the imaging unit 30 at a position where the first orientation flat 105 can be imaged.

In the positioning step 1001, the controller 70 first estimates the coordinates of a center of the first orientation flat 105 on the basis of information on the center coordinates and the diameter of the first surface 101 of the workpiece 100 as determined by the previously performed edge alignment and the position, where the first orientation flat 105 is formed, and the length of the straight-line segment stored beforehand in the storage section 71. In the positioning step 1001, the controller 70 next relatively moves the imaging unit 30 to a position near the center of the first orientation flat 105 by moving the holding table 10 along the X-axis direction and Y-axis direction with the X-axis direction moving unit 41 and the Y-axis direction moving unit 42, on the basis of the estimated coordinates of the center of the first orientation flat 105.

Figure 6:
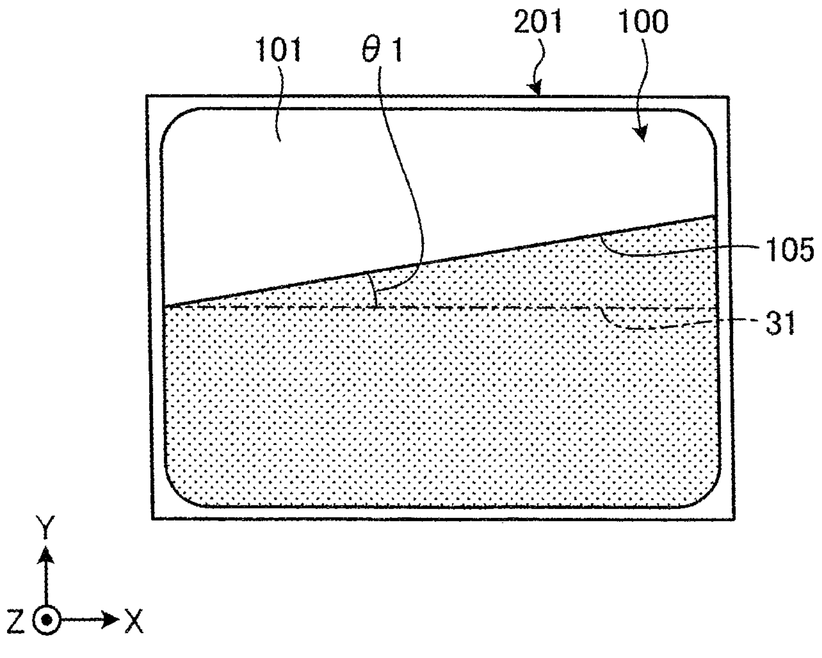
FIG. 6 is a view illustrating an example of a captured image acquired in a straight-line detection step in FIG. 3.

FIG. 6 is a view illustrating an example of the captured image 201 acquired in the straight-line detection step 1002 in FIG. 3. The straight-line detection step 1002 is performed to acquire the captured image 201, which is illustrated in FIG. 6, by imaging the first orientation flat 105 with the imaging unit 30 positioned in the positioning step 1001, and to detect the straight-line segment in the captured image 201. In the straight-line detection step 1002, the controller 70 detects the XY coordinates of multiple points on a boundary, which indicates the first orientation flat 105, between high luminance and low luminance in the captured image 201 acquired by the imaging, and performs arithmetic processing such as a Hough transform on the XY coordinates of the multiple points in the captured image 201 to detect the straight-line segment, which corresponds to the first orientation flat 105, in the captured image 201.

The first alignment step 1003 is performed to calculate an off-angle θ1 (see FIG. 6) between an extending direction of the straight-line segment detected in the straight-line detection step 1002 and the desired direction, and to position the first orientation flat 105 based on the off-angle θ1 such that the extending direction of the straight-line segment extends parallel to the desired direction.

In the first alignment step 1003 in this embodiment, as illustrated in FIG. 6, the extending direction of the straight-line segment detected in the straight-line detection step 1002 corresponds to the extending direction of the first orientation flat 105 in the captured image 201, and the desired direction is set to be the X-axis direction as mentioned above, and is the extending direction of the base line 31 in the captured image 201. In the first alignment step 1003, on the basis of an equation of a straight line 105-3 (see FIG. 10) corresponding to the first orientation flat 105 as detected in the straight-line detection step 1002 and a straight-line equation of the base line 31, the controller 70 calculates, as the off-angle θ1, the angle between the straight line 105-3, which corresponds to the first orientation flat 105, and the base line 31.

In the first alignment step 1003, the controller 70 rotates the holding table 10 with the rotary drive source by the same amount as the calculated off-angle θ1 in a direction to cancel out the off-angle θ1, whereby the workpiece 100 is rotated by an angle −θ1 to rotate the extending direction of the first orientation flat 105 by the angle −θ1, and the first orientation flat 105 is hence positioned such that the extending direction of the first orientation flat 105 extends parallel to the extending direction of the base line 31.

In the first alignment step 1003, the alignment that brings the extending direction of the first orientation flat 105 into parallel with the desired direction can be applied within the detection limit for the off-angle θ1 that is applicable when the off-angle θ1 is calculated using the straight line detected in the area of the single captured image 201. The first alignment step 1003 performs a coarser alignment than the second alignment step 1004 to be mentioned below, that is, a coarse alignment step.

In the first alignment step 1003, the controller 70 may fail to find the first orientation flat 105 within the imaging area of the imaging unit 30 due to the alignment that has brought the extending direction of the first orientation flat 105 into parallel with the extending direction of the base line 31. In such a case, the controller 70 moves the holding table 10 further along the Y-axis direction by the Y-axis direction moving unit 42 in the first alignment step 1003, whereby the imaging unit 30 is relatively moved along the Y-axis direction to make an adjustment such that the first orientation flat 105 enters the imaging area of the imaging unit 30.

Figure 7:
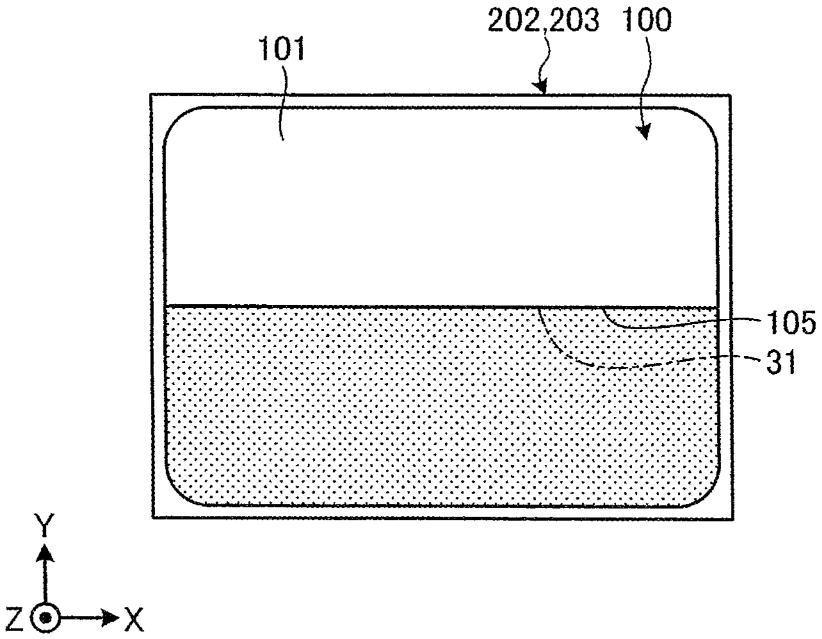
FIG. 7 is a view illustrating an example of a captured image acquired after performing a first alignment step in FIG. 3.

FIG. 7 is a view illustrating an example of a captured image 202 acquired after performing the first alignment step 1003 in FIG. 3. After the alignment has been applied in the first alignment step 1003, the controller 70 images the first orientation flat 105 by the imaging unit 30, whereby as illustrated in FIG. 7, the captured image 202, in which the extending direction of the first orientation flat 105 extends parallel to the extending direction of the base line 31, can be acquired.

Figure 8:
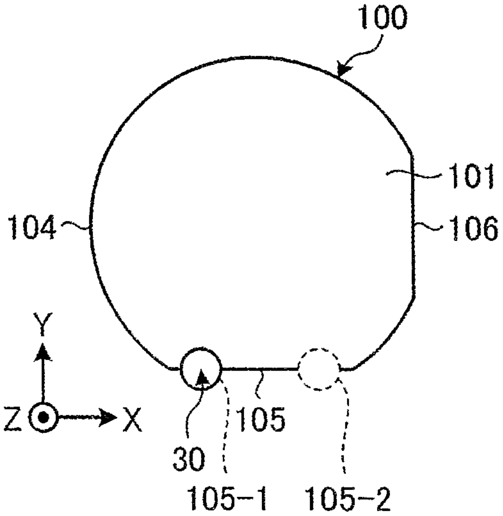
FIG. 8 is a top view illustrating a second alignment step in FIG. 3.
Figure 9:
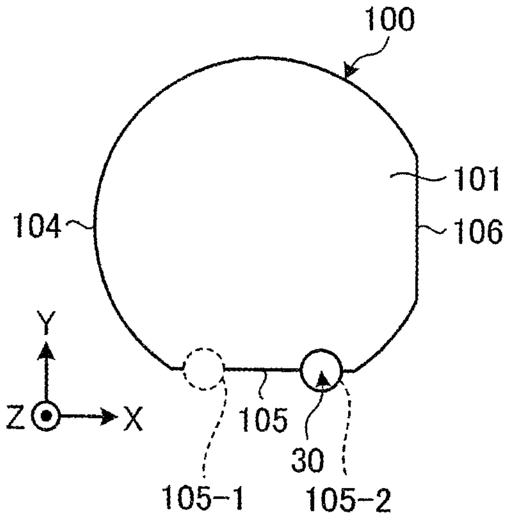
FIG. 9 is a top view illustrating the second alignment step in FIG. 3.

FIGS. 8 and 9 are top views both illustrating the second alignment step 1004 in FIG. 3. As illustrated in FIGS. 8 and 9, after performing the first alignment step 1003, the second alignment step 1004 is performed to image the first orientation flat 105 at a first position 105-1 and a second position 105-2, which are spaced apart from each other along the desired direction (X-axis direction), and to position the first orientation flat 105 such that a straight line 105-3 (see FIG. 10), which connects together the first orientation flat 105 at the first position 105-1 and the first orientation flat 105 at the second position 105-2, extends parallel to the desired direction. It is to be noted that the desired direction is set to be the X-axis direction in this embodiment.

In the second alignment step 1004, as illustrated in FIG. 8, the controller 70 first relatively moves the imaging unit 30 to the first position 105-1 by the X-axis direction moving unit 41 and the Y-axis direction moving unit 42, and, while shifting the imaging unit 30 relatively and incrementally by a minute distance along the Y-axis direction with the Y-axis direction moving unit 42, images the first orientation flat 105 at the first position 105-1 to acquire multiple first orientation flat images. The controller 70 then performs pattern matching between the first orientation flat image 203 (see FIG. 7) to be used as a reference and the first orientation flat images to detect one of the first orientation flat images that has the same orientation flat ratio as that in the orientation flat image 203 to be used as the reference. Here, in this embodiment, the controller 70 uses, as the orientation flat image 203 for use as the reference, the captured image 202 acquired after performing the first alignment step 1003. Further, the orientation flat ratio means the ratio of the area of a region inside the periphery of the first orientation flat 105 to the area of a region outside the periphery of the first orientation flat 105, and is the ratio of the area of a high-luminance region, which indicates the area of the region inside the periphery of the first orientation flat 105, to the area of a low-luminance region, which indicates the area of the region outside the periphery of the first orientation flat 105. As illustrated in FIG. 9, the controller 70 also acquires multiple second orientation flat images at the second position 105-2 as at the first position 105-1, and detects one of the second orientation flat images that has the same orientation flat ratio as that in the orientation flat image 203 to be used as the reference, by pattern matching.

Figure 10:
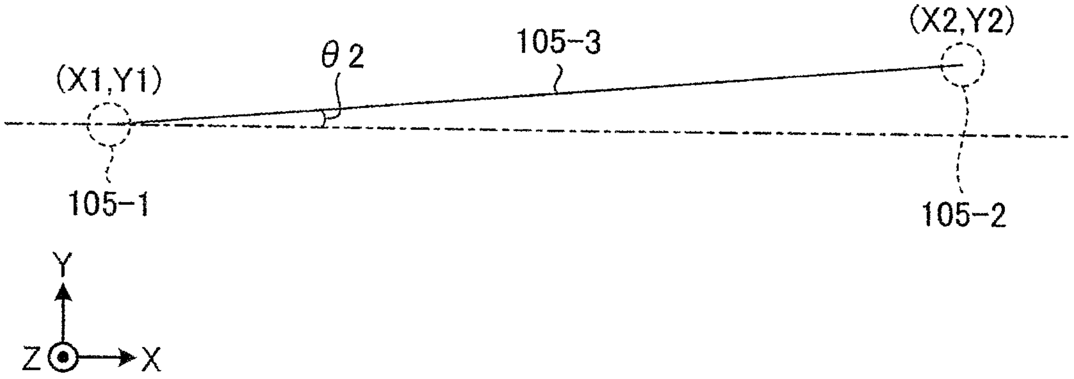
FIG. 10 is a view illustrating the second alignment step in FIG. 3.

FIG. 10 is a view illustrating the second alignment step 1004 in FIG. 3. In the second alignment step 1004, as illustrated in FIG. 10, the controller 70 next determines XY coordinate positions ((X1, Y1) in FIG. 10) in the first orientation flat image detected at the first position 105-1, and XY coordinate positions ((X2, Y2) in FIG. 10) in the second orientation flat image detected at the second position 105-2. The controller 70 determines the XY coordinate positions in each orientation flat image on the basis of the XY coordinates of the corresponding position of the imaging unit 30 when the orientation flat image is captured. On the basis of the XY coordinate positions in the first orientation flat image as detected at the first position 105-1 and the XY coordinate positions in the second orientation flat image as detected at the second position 105-2, the controller 70 then calculates an equation of the straight line 105-3 which connects together the first orientation flat 105 at the first position 105-1 and the first orientation flat 105 at the second position 105-2. On the basis of the equation of the straight line 105-3 and the straight-line equation of the base line 31, the controller 70 calculates, as an off-angle θ2, the angle between the straight line 105-3, which corresponds to the first orientation flat 105, and the base line 31.

In the second alignment step 1004, the controller 70 then rotates the holding table 10 with the rotary drive source by the same amount as the calculated off-angle θ2 in a direction to cancel out the off-angle θ2, whereby the workpiece 100 is rotated by an angle −θ2 to rotate the extending direction of the first orientation flat 105 by the angle −θ2, and the first orientation flat 105 is hence positioned such that the extending direction of the first orientation flat 105 extends parallel to the extending direction of the base line 31.

In the second alignment step 1004, the alignment that brings the extending direction of the first orientation flat 105 into parallel with the desired direction can therefore be applied within the detection limit for the off-angle θ2 that is applicable when the off-angle θ2 is calculated using the straight line 105-3 which connects together the first orientation flat 105 at the first position 105-1 and the first orientation flat 105 at the second position 105-2 spaced apart from the first position 105-1 along the desired direction (X-axis direction). As the detection limit for the off-angle θ2 is smaller than the detection limit for the off-angle θ1 in the first alignment step 1003, the second alignment step 1004 performs a finer alignment than the first alignment step 1003, that is, a fine alignment step.

With the alignment method according to this embodiment, the first orientation flat 105 is aligned with the direction parallel to the X-axis direction over two stages as described above, so that the moving direction of the convergence point of the laser beam to be applied to form cleavage layers can be accurately aligned in the direction parallel to the Y-axis direction. Subsequently, the holding table 10 is rotated by 90 degrees such that the moving direction of the convergence point of the laser beam, which is to be applied to form cleavage layers, is directed in the direction parallel to the X-axis direction. After that, the laser beam is applied by the laser beam irradiation unit 20 with its convergence point positioned inside the workpiece 100, whereby cleavage layers can be suitably formed.

The alignment method according to this embodiment, which has the configuration as described above, performs fine alignment using pattern matching at two positions, which are spaced apart from each other, in the second alignment step 1004 after performing coarse alignment using a straight-line detection method without using pattern matching in the first alignment step 1003. Even if the workpiece 100 is turned by vibrations or the like during transfer and the angle (extending direction) of the first orientation flat 105 substantially deviates with respect to the X-axis direction, the potential incapability of performing alignment for impossible pattern matching due to the substantial deviation of the first orientation flat 105 can be suppressed accordingly. Unlike the related art, the repositioning operation of the workpiece 100 by the operator is hence obviated. The alignment method according to this embodiment therefore exhibits an advantageous effect that alignment can be efficiently and accurately performed even if the angle (extending direction) of the first orientation flat 105 has substantially deviated. Hence, the alignment method according to this embodiment contributes to reduction in the number of steps for alignment and the prevention of human mistakes by the operator.

Further, in the second alignment step 1004, the alignment method according to this embodiment detects orientation flat images that have the same orientation flat ratio as the orientation flat ratio in the orientation flat image 203 that serves as the reference, at the first position 105-1 and the second position 105-2 by pattern matching, and calculates the angle (extending direction) of the first orientation flat 105 on the basis of the XY coordinate positions of the first orientation flat image detected at the first position 105-1 and the XY coordinate positions of the orientation flat image detected at the second position 105-2. The alignment method according to this embodiment therefore can accurately determine the position of each orientation flat image by the pattern matching with the use of the orientation flat ratio, so that the angle (extending direction) of the first orientation flat 105 can be accurately calculated, thereby enabling accurate performance of the alignment.

In addition, the alignment method according to this embodiment performs pattern matching using the captured image 202 of the first orientation flat 105, which has been acquired at the time of detection of the straight line to perform the coarse alignment, as the orientation flat image 203 for use as a reference when performing the fine alignment, thereby obviating the need to record (teach) a pattern image of an orientation flat beforehand unlike the related art.

[Modification]

Figure 11:
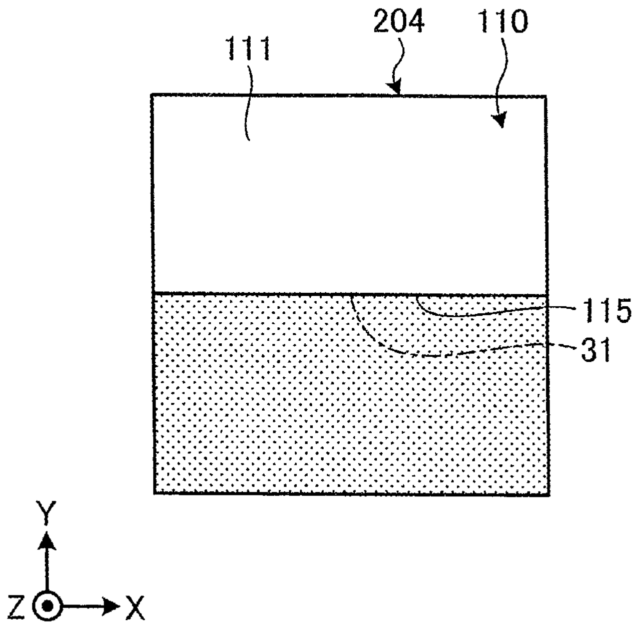
FIG. 11 is a view illustrating an example of an orientation flat image that serves as a reference to be used in a second alignment method of an alignment method according to a modification of the embodiment.

An alignment method according to a modification of the embodiment will hereinafter be described on the basis of FIG. 11. FIG. 11 is a view illustrating an example of an orientation flat image 204 that serves as a reference to be used in a second alignment step 1004 of the alignment method according to the modification of the embodiment. In FIG. 11, portions identical to those in the embodiment are identified by the same reference signs, and their description is omitted.

In the alignment method according to the modification, the orientation flat image 203 to be used as the reference in the second alignment step 1004 in the embodiment has been changed to the orientation flat image 204 illustrated as the reference in FIG. 11. As illustrated in FIG. 11, the orientation flat image 204 that serves as the reference is a pattern image created artificially and stored in the storage section 71 beforehand, and with a dummy first orientation flat 115 overlapping a base line 31 and serving as a boundary, a dummy first surface 111 of a dummy workpiece 110, which is in a region radially inside the dummy first orientation flat 115, has high luminance, and a region radially outside the dummy first orientation flat 115 has low luminance.

Using the orientation flat image 204 as the reference as described above, the alignment method according to the modification can also perform pattern matching between the orientation flat image 204 and multiple first orientation flat images and second orientation flat images as in the embodiment. The alignment method according to the modification obviates the need to record (teach) a pattern image of an orientation flat, which serves as a reference, beforehand unlike the related art, and therefore exhibits a similar advantageous effect as the embodiment.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An alignment method for aligning an orientation flat that is formed on a circular workpiece having a first surface and a second surface opposite the first surface and a peripheral surface extending from the first surface to the second surface at an outer edge of the workpiece, the orientation flat being formed on the peripheral surface with a direction parallel to a desired direction, the method comprising:

a positioning step of positioning an imaging unit, which images the workpiece, at a position where the orientation flat is able to be imaged;

a straight-line detection step of imaging the orientation flat by the imaging unit to acquire a captured image and detecting a straight-line segment in the captured image;

a first alignment step of calculating an off-angle between an extending direction of the straight-line segment detected in the straight-line detection step and the desired direction, and, on a basis of the off-angle, positioning the orientation flat such that the extending direction of the straight-line segment extends parallel to the desired direction; and a second alignment step of, after performing the first alignment step, imaging the orientation flat at a first position and a second position, which are spaced apart from each other along the desired direction, and positioning the orientation flat such that a line that connects together the orientation flat at the first position and the orientation flat at the second position extends parallel to the desired direction.

2. The alignment method according to claim 1, wherein the second alignment step detects orientation flat images that have a same orientation flat ratio as an orientation flat ratio in an orientation flat image that serves as a reference, at the first position and the second position by pattern matching, calculates an off-angle between the orientation flat and the desired direction on a basis of XY coordinate positions of the orientation flat image detected at the first position and XY coordinate positions of the orientation flat image detected at the second position, and positions the orientation flat such that the orientation flat extends parallel to the desired direction.

3. The alignment method according to claim 2, wherein a captured image that has been acquired by imaging the orientation flat after application of alignment in the first alignment step is used as the orientation flat image that serves as the reference.

4. The alignment method according to claim 2, wherein an orientation flat image that has been created and stored is used as the orientation flat image that serves as the reference.

* * * * *